US009016696B2

(12) United States Patent
Borowsky et al.

(10) Patent No.: US 9,016,696 B2
(45) Date of Patent: Apr. 28, 2015

(54) AIR SEAL FOR SERVER RACK

(75) Inventors: Erez Borowsky, Albuquerque, NM (US); James R. Fink, Exeter, RI (US)

(73) Assignee: Upsite Technologies, Inc., Albuquerque, NM (US)

( * ) Notice: Subject to any disclaimer, the term of this patent is extended or adjusted under 35 U.S.C. 154(b) by 454 days.

(21) Appl. No.: 13/335,554

(22) Filed: Dec. 22, 2011

(65) Prior Publication Data

US 2013/0161273 A1    Jun. 27, 2013

(51) Int. Cl.
  *A47F 7/00*  (2006.01)
  *H05K 7/20*  (2006.01)

(52) U.S. Cl.
  CPC .................. *H05K 7/20736* (2013.01)

(58) Field of Classification Search
  CPC ..................................................... H05K 7/183
  USPC .................. 277/630, 636, 637, 644
  See application file for complete search history.

(56) References Cited

U.S. PATENT DOCUMENTS

| D372,074 S   | * | 7/1996 | Wallace et al. | D23/269 |
| 2008/0190046 A1 | * | 8/2008 | Hecht et al. | 52/173.1 |
| 2009/0139742 A1 | * | 6/2009 | Bhosale | 174/58 |
| 2009/0140499 A1 | * | 6/2009 | Kline | 277/645 |
| 2009/0315269 A1 | * | 12/2009 | Deiss | 277/316 |
| 2011/0186577 A1 | * | 8/2011 | Limbert et al. | 220/378 |

OTHER PUBLICATIONS

"Ducted Exhaust Cabinet~Managing Exhaust Airflow Beyond Hot Aisle/Cold Aisle" CPI (Chatsworth Products, Inc.); © 2006 Chatsworth Products, Inc.; 11 pages.
John Niemann; "Hot Aisle Vs. Cold Aisle Containment"; APC by Schneider Electric; © 2008 American Power Conversion; 13 pages.

\* cited by examiner

*Primary Examiner* — Gilbert Lee
(74) *Attorney, Agent, or Firm* — St. Onge Steward Johnston & Reens LLC

(57) ABSTRACT

An air seal for a server rack installed in a data center which delivers cool air to the fronts of racks and removes warm air at the back, where one or more of the racks are elevated by wheels or legs. A seal support member of rigid plastic and of right angle cross section has a horizontal portion and a vertical portion. The horizontal portion is adhesively secured to a downwardly facing surface at the bottom front and/or back of the rack. The horizontal portion is recessed at opposite ends to accommodate wheels or legs at opposite sides of the rack. The vertical portion extends across the full width of the rack and projects downward. A sealing strip of EPDM foam is adhesively secured to the vertical portion and is held flexed against the floor, forming a seal against the flow of by-pass air underneath the rack.

7 Claims, 4 Drawing Sheets

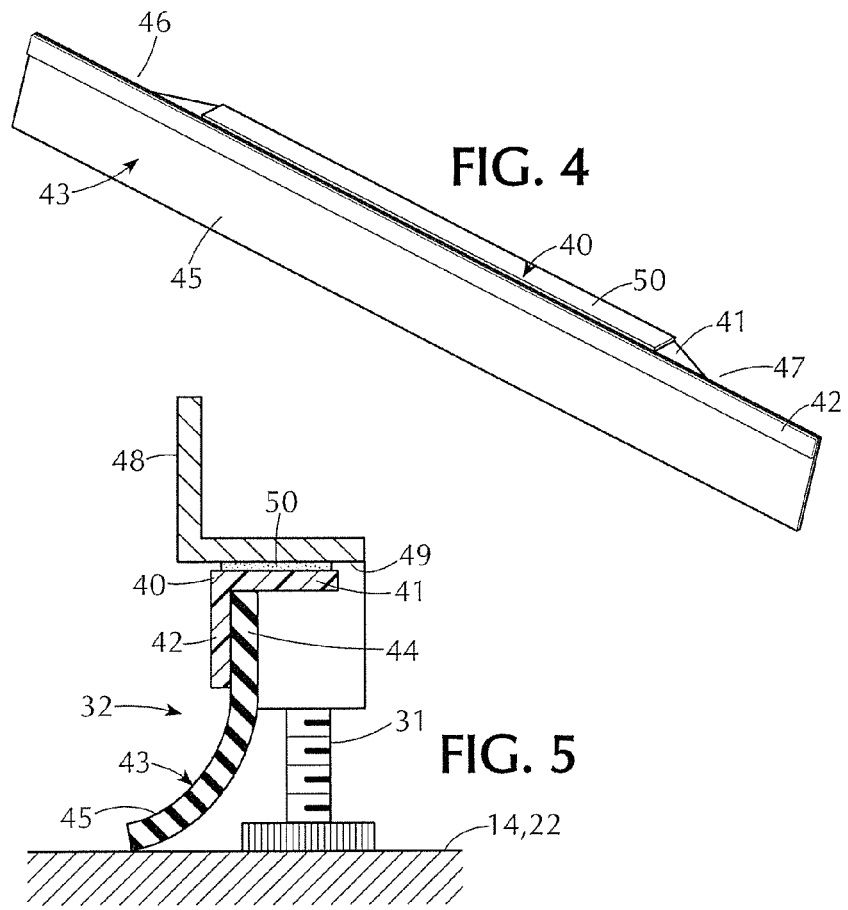
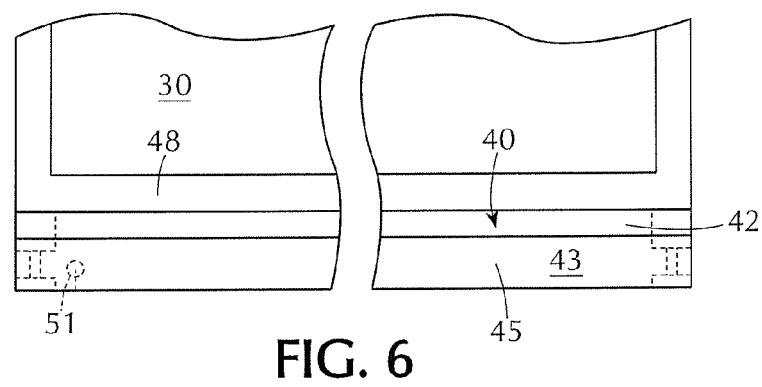

AIR SEAL FOR SERVER RACK

FIELD OF INVENTION

The present invention relates to air flow control devices for increasing efficiencies in the supply of cooling air in data centers and the like housing a plurality of racks of servers. More particularly, the invention is directed to a simple, relatively inexpensive, easily installed and highly effective sealing device for minimizing the bypass flow of cooling air in such environments.

BACKGROUND OF THE INVENTION

Modern data centers house large numbers of computer servers, typically in frame racks, in which a plurality of servers are mounted in a closely spaced relation. In operation the densely arranged servers generate substantial heat, which must be removed in order to prevent overheating and malfunction of the equipment. The individual server units generally are provided with internal fans, which pull cooling air through the unit. However, because of the high density of the equipment, it is customary to provide substantial air conditioning systems to supply cooled air to the fronts of the racks, available to be drawn through the individual servers by their internal fans.

Operating efficiency of the cooling systems has become an increasing problem as the power output of the servers has been progressively increased and the expense of cooling them has become very meaningful. A significant aspect of controlling cooling costs is the prevention or minimization of mixing of the supplied cool air with warm air in the data center, without the cool air having been passed through a server and absorbed its heat. Where mixing is allowed to occur outside of the servers, the capacity of the A/C equipment must be enlarged, at increased capital expense up front, and the efficiency of the A/C equipment is compromised by the lower temperature differential between the air supplied to and delivered by the A/C equipment.

Among the techniques employed at modern data centers are hot-air-cold air aisles, hot air containment and cold air containment. For the hot-air-cold air aisles, servers are arranged side-by-side in rows. Two rows of servers are oriented back to back, with cool air being supplied to the fronts of the rows (cold aisles) and warm air being collected in the hot aisle between the two rows and returned to the A/C unit. This technique represents an improvement over previous arrangements but still permits considerable quantities of the cool air to bypass the servers and mix with warm air.

The hot air containment procedure is similar to the above but involves completely closing off the hot aisle at the top and ends, to further reduce the amount of cool air permitted to return without passing through a server, while allowing the cool air to be present generally throughout the room. Warm air from the enclosed hot aisle is ducted back to the A/C unit and a relatively high efficiency is achieved. In some cases warm air is ducted out of the backs of each of the server cabinets and returned to the A/C unit. Cold air containment is similar to the hot air containment procedure, except that the cold air is contained in an aisle space and warm air is present throughout the room. This procedure is not as widely used as hot air containment because the presence of the warm air generally throughout the room makes for an uncomfortable working environment.

Even in relatively efficient systems, such as hot air containment, there still can be significant efficiency losses. For example, in some cases the server racks or cabinets have wheels of leveling legs at the bottom, which elevate the racks above the floor and provide a path for substantial amounts of cool air to bypass the servers and combine directly with the hot air. Such losses have become an increasing issue as the power of the servers has been increased and along with that the power of the A/C systems and the increased pressure differentials utilized therein. There has been a definite need for a sealing device that can be quickly and easily attached at the front and/or back of a server rack or cabinet, to seal off the space between the floor and the bottom of the rack and prevent the flow of bypass air underneath the rack or cabinet.

SUMMARY OF THE INVENTION

The invention is directed to a simple, inexpensive and easily installed retrofit sealing device for sealing the space between the bottom of a server rack and the floor, where the rack is elevated on wheels or legs. This space has often been ignored and left open, because an easy and effective solution was not available, resulting is a significant loss of cooling air and reduction in data center efficiency. The device of the invention utilizes a rigid plastic support member forming a horizontal upper portion and a vertical lower portion in the installed orientation of the device. The support member extends the full width of the cabinet and the upper portion thereof is adhesively secured to a downwardly facing surface of the rack. A soft foam sealing strip is secured to the lower portion of the support member and extends downward into contact with the floor to effectively seal off the open space underneath the cabinet. The upper portion of the support member is recessed at opposite ends to accommodate the wheels or legs of the cabinet.

For a more complete understanding of the above and other features and advantages of the invention, reference should be made to the following detailed description of a preferred embodiment of the invention and to the accompanying drawings.

BRIEF DESCRIPTION OF THE DRAWINGS

FIG. 4 is a perspective view of a sealing device embodying features of the invention.

FIG. 5 is an enlarged, fragmentary cross sectional view showing the seal of the invention installed underneath the front of a server cabinet or rack to block a front-to-back flow of air underneath the cabinet.

FIG. 6, is a fragmentary front elevational view of a server cabinet as shown in FIG. 3, with the air seal device of the invention installed thereon.

DETAILED DESCRIPTION OF THE INVENTION

Figure 1:
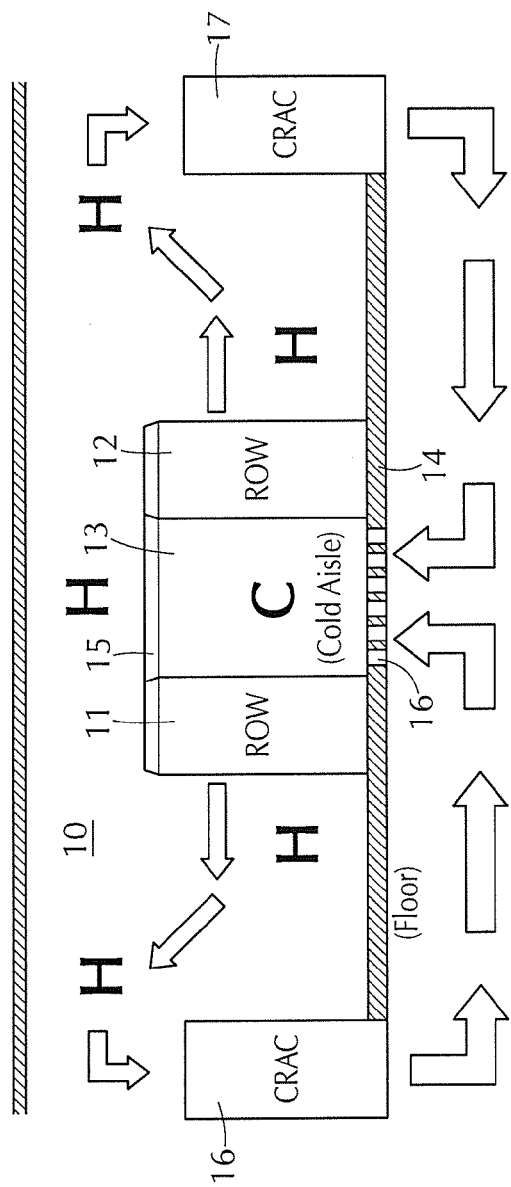
FIG. 1 simplified representation of a cold air containment system for cooling servers in a data center.

Referring now to the drawings, the reference numeral 10 (FIG. 1) designates a form of computer room of a typical data center. The room is set up with two rows of server racks or cabinets 11, 12 placed in tight side-by-side arrangement. For simplification, the terms cabinet or rack will be used interchangeably herein and in the claims to refer to either form of structure.

The fronts of the racks face toward a confined cold aisle 13, which is enclosed on the sides by the computer rows, on the bottom by a floor 14 and at the top by a cover 15. Cooled air is delivered to the cold aisle 13 by computer room air conditioners (CRAC) 16, 17 at each side, directing cooled air under the floor and into the cold aisle via floor openings 15.

In a typical data center large numbers of individual servers (not shown) are stacked in the racks 11, 12 and are provided with their own internal fans to draw in the cooled air from the aisle 13 and discharge the air, with added heat, from the backs of the racks 11, 12 into the room 10, to be circulated back to the air conditioners 16, 17.

A cold air confinement system, illustrated in FIG. 1, is similar in several ways with the hot aisle-cold aisle system except that, in the latter, the confinement cover 15 is not provided over the cold aisle(s), such that there can be mixing of warm and cooled air over the tops of the server cabinets. Accordingly, the cold air containment system can make more efficient use of the cooling capacity of the A/C equipment than the hot aisle-cold aisle system.

Figure 2:
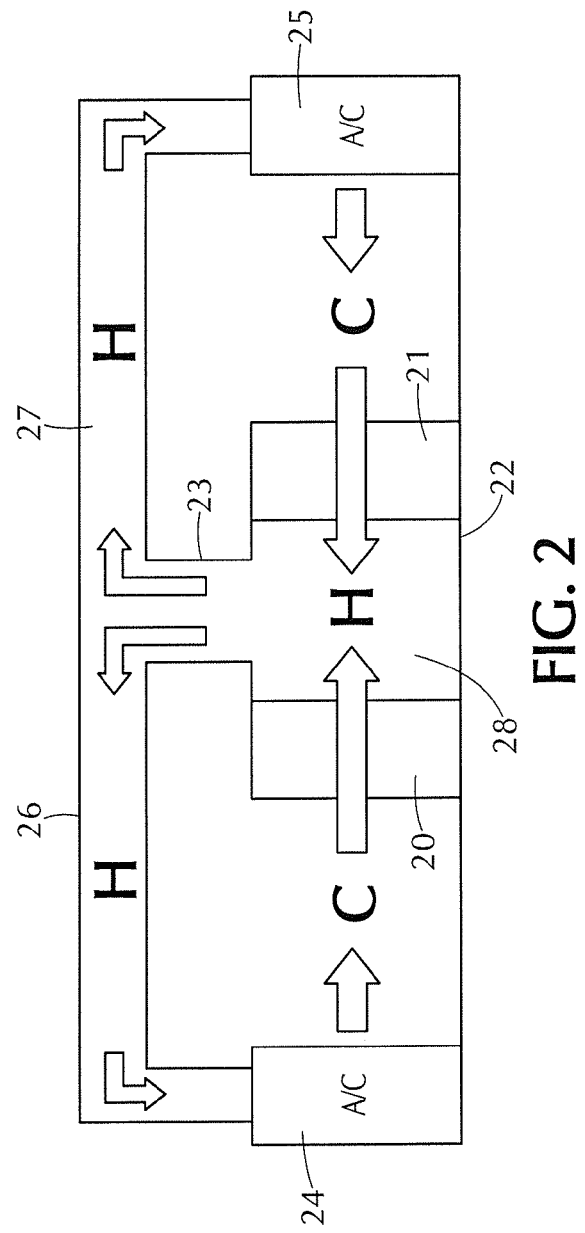
FIG. 2 a simplified representation of a hot air containment system used in a data center.

FIG. 2 illustrates a hot air containment system in which rows 20, 21 of server racks are oriented back-to-back defining, along with a floor 22 and outlet duct 23, a confined space for the warm discharged from the backs of the racks. The warm air is conveyed back to air conditioning units 24, 25 through ceiling ducts 26, 27. The hot air containment system of FIG. 2 is similar in efficiency with the cold air containment system of FIG. 1, although the hot air containment system offers a more comfortable working environment. In some cases, warm air is collected and ducted away from the individual racks instead of being collected in a hot aisle space 28 behind the cabinets.

Figure 3:
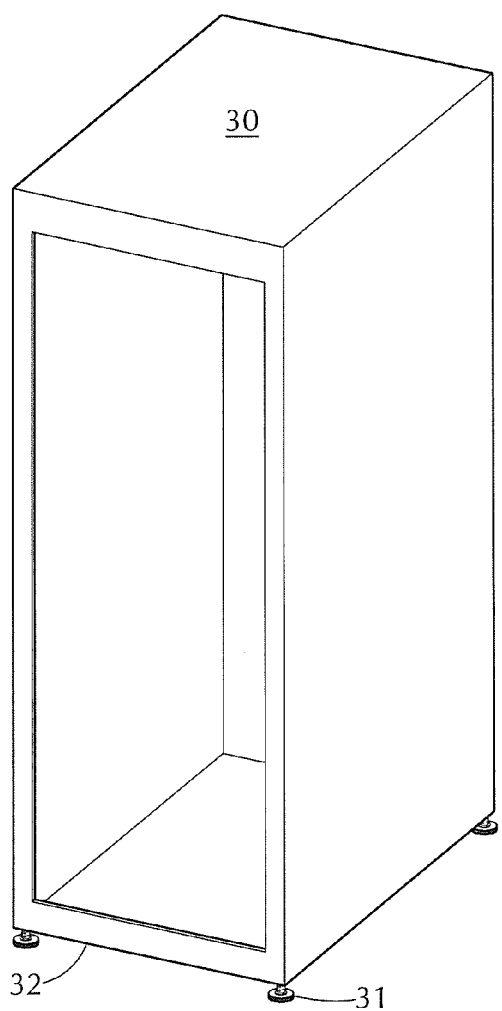
FIG. 3 is a perspective illustration of one form of server cabinet utilized in data centers.

In FIG. 3 there is shown a representative form of cabinet 30, which can house a suitable framework (not shown) for mounting a large number of servers (not shown). Alternatively the basic server-mounting structure can be a framework to which exterior panels can be attached. The servers typically are combined with blanking panels (not shown), if necessary, such that the front of the rack presents a generally continuous front surface, with the objective of requiring all of the air from the cold side to flow through the servers in order to reach the warm side.

In many instances, the cabinets or racks which mount the servers are elevated slightly above the ground, either by mounting the racks on wheels by providing the racks with adjustable legs 31 for leveling purposes. In such cases, there is an air space 32 between the bottom of the rack and the floor (14, 22) which permits the passage of cooled air underneath the rack to mix directly with warm air, without passing through and providing cooling for a server. This loss frequently has been ignored in the past, because of the inconvenience of dealing with it. However, especially with higher power servers and the use of hot and cold air containment configurations, the pressure differentials between opposite sides of a server rack are becoming larger. As a result, air spaces under the computer racks can result in meaningful flow of bypass air and corresponding losses in cooling efficiency and along with increases in the operating expenses of a data center.

According to the invention a simple, inexpensive sealing device is provided, which can be installed with a minimum of time, effort and expense to effectively seal off the space that may exist between the rack and the floor. With reference to FIGS. 4-6, the sealing device, shown by itself in FIG. 4, comprises an elongated support member 40 which is of a length equal to the width of the rack 30. The support member preferably is formed of a suitable plastic, such as ABS, and has an upper portion 41 and a lower portion 42 disposed at right angles to the upper portion.

A sealing strip 43 has an upper portion 44 secured (preferably by adhesive bonding) to a back surface of the lower portion 41 of the support member 40. A lower portion 45 of the sealing strip projects downward below the lower portion 42 of the support member a distance greater than the spacing between the lower portion 42 and the floor 14, 22, such that the sealing strip is flexed enough to be pressed resiliently against the floor. A preferred material for the sealing strip 43 is an EPDM foam material of, for example $1/4^{th}$ inch in thickness, which is rugged but soft and easily flexed in order to form an effective seal.

As shown in FIG. 6, the sealing strip 43 has a length substantially equal to the width of the rack 30 so as to seal the entire space under the rack. In this respect, it will be understood that in a typical data center, the racks 30 are arranged in tight side-by-side rows. Accordingly, sealing the space across the fronts and/or backs of the server racks serves to prevent bypass flow underneath the racks. In many cases it is sufficient to utilize a only single seal positioned at the front (i.e., the cold side) of the rack.

Convenience of installation is an important feature of the present invention in order that data center operators will not be deterred from installing the seals because of constraints on time and personnel. To this end, the device of the invention has pre-formed recesses 46, 47 at each end of the upper portion 41 of the support member 40 (FIG. 4) in order to accommodate the presence of legs or wheels 31 at the sides of the rack. This enables the support member to be easily inserted underneath the rack to a position in which the sealing strip 43 is underneath a downwardly facing surface 49 thereof. Additionally, the upper portion 41 of the support member has a double sided foam tape 50, with one side adhesively secured to its upwardly facing surface. The tape 50, in itself conventional, is provided with a release strip (not shown) on its upper surface which is pulled away by a service person to expose an upper adhesive layer of the tape.

Installation of the air seal of the invention requires only that a the release strip be removed from the tape 50, following which the support member is pressed upwardly against the downwardly facing surface 49 of the rack. The sealing strip easily flexes to allow a worker's hands to extend under the seal to position the support member and press it upwardly against the rack surface 49. The task takes a few minutes at most and provides a permanent and highly effective seal of the under-rack space to prevent undesired bypass flow of air in that space.

In a typical installation it would not be necessary to extend cables underneath the sealing elements 43. However, it case that should be necessary or desirable, the sealing elements can be provided with one or more key-hole score patterns 51 (FIG. 6) comprised of a circular score pattern within the sealing element, with a linear score line connecting the circular pattern to a lower edge of the element. The circular score can be punched out to form an opening closely accommodate the cable or cables while maintaining a highly effective seal.

It should be understood, of course, that the specific embodiment or embodiments of the invention herein illustrated and described are intended to be representative of the invention and not in limitation thereof. Accordingly, reference should be made to the following appended claims in determining the full scope of the invention.

What is claimed is:

1. An air seal suitable for and intended for retrofit installation on an underside of an elevated server rack to close an existing space between the server rack and an underlying floor surface on which the server rack is supported, the server rack being of predetermined width having a downwardly facing, transversely disposed and generally horizontal surface adjacent at least one of a front or back of said server rack which surface is elevated a distance above said underlying floor surface, said air seal comprising
- an elongated support member formed of substantially rigid material and having, in cross sectional configuration, upper and lower support portions disposed substantially at right angles to each other,
- said elongated support member having a length corresponding closely with the predetermined width of said server rack,
- an adhesive strip element on an upper surface of said upper support portion, said adhesive strip element having an upwardly facing adhesive surface to adhesively secure said upper support portion to said elevated, downwardly facing horizontal surface,
- said upper support portion being formed with recesses at opposite ends thereof to accommodate legs or wheels at sides of the server rack,
- said lower support portion of said elongated support member extending downward from said upper support portion in an installed position of said elongated support member and said lower support portion having a lower edge, and
- an elongated strip of elastically flexible material having an upper portion secured to a surface of said lower support portion and extending substantially the full length of said lower support portion
- said elongated sealing strip of flexible material having an unsupported flexible lower portion extending downward below the lower edge of said lower support portion a distance such that, when said upper support portion is installed on said downwardly facing elevated surface, a lower portion of said strip of flexible material will engage and be resiliently displaced by said underlying floor surface to form an air seal between said floor surface and said downwardly facing surface of said server rack,
- said elongated sealing strip being sufficiently flexible to enable said support member and said sealing strip to be manually inserted into the existing space between said downwardly facing surface and said floor surface and pressed upwardly to adhere said adhesive strip to said downwardly facing surface.

2. An air seal according to claim 1, wherein
said adhesive strip element is in the form of a double-sided foam tape, with adhesive layers on opposite surfaces thereof,
the adhesive layer on one surface of said adhesive strip element is bonded to an upper surface of said upper support portion and
the adhesive layer on the opposite surface of said adhesive strip element is initially covered by a removable strip.

3. An air seal according to claim 1, wherein
said elongated sealing strip of flexible material comprises a strip of EPDM foam.

4. An air seal especially suitable for and especially intended for use as a seal for retrofit installation underneath an elevated server rack to close an existing space between the server rack and an underlying floor surface on which the server rack is supported, the server rack being of predetermined width and having a downwardly facing, transversely disposed and generally horizontal flat surface adjacent at least one of a front or back of said server rack which surface is elevated a distance above said underlying floor surface and defines therewith said existing air space, said air seal comprising
- an elongated support member formed of rigid plastic material and having, in cross sectional configuration, first and second portions disposed at right angles to each other, said first portion comprising, when said elongated support member is installed, a horizontally oriented upper portion and said second portion comprising a vertically oriented lower portion,
- said support member having a length corresponding to a width of a server rack,
- said upper portion being recessed at opposite ends thereof relative to said lower portion to accommodate legs or wheels extending from a bottom of the server rack,
- a two-sided adhesive strip extending lengthwise on an upper surface of said upper portion and having a lower adhesive side thereof bonded to said upper surface between the recessed ends of said upper portion,
- said adhesive strip comprising an elongated body of a plastic foam material and having an upper adhesive side thereof covered by a removable cover strip enabling, when said cover strip is removed, said upper adhesive side to be bonded to said downwardly facing elevated surface of said server rack, and
- a resilient foam sealing strip adhesively bonded to the lower portion of said support member
- said resilient foam sealing strip being of a length corresponding to the length of the lower portion of said support member and having an upper portion thereof bonded to a vertically oriented surface of the lower portion of said support member,
- said resilient foam sealing strip having an unsupported flexible lower portion thereof extending a sufficient distance below a lower edge of the lower portion of said support member to flexibly engage with and be displaceable by said floor surface supporting said rack, when said support portion is installed on said downwardly facing elevated surface, to form a seal between said floor surface and said elongated support member,
- said resilient foam sealing strip being sufficiently flexible to enable said support member and said sealing strip to be manually inserted into the existing space between said downwardly facing surface and said floor surface and pressed upwardly to adhere said adhesive strip to said downwardly facing surface.

5. An air seal according to claim 4, wherein,
the lower portion of said support member extends for a predetermined distance downward from said upper portion, and
the unsupported flexible lower portion of said resilient foam sealing strip extends downward beyond the lower edge of the lower portion of said support member by a distance greater than said predetermined distance.

6. An air seal according to claim 5, wherein
said lower portion of said support member has a back surface facing in a direction toward said the upper portion of said support member and a front surface facing in a direction away from the upper portion of said support member, and
said resilient foam sealing strip is bonded to the back surface of said lower portion.

7. An air seal according to claim 5, wherein,
said resilient foam sealing strip is in the form of an elongated flat strip of uniform cross section.

* * * * *